United States Patent
Maquiné et al.

(10) Patent No.: US 8,780,322 B2
(45) Date of Patent: Jul. 15, 2014

(54) OBJECT WITH AN IMPROVED SUITABILITY FOR A PLASMA CLEANING TREATMENT

(75) Inventors: Johannes Maquiné, Eindhoven (NL); Herbert Wituschek, Heidelberg (DE)

(73) Assignee: ASML Netherlands B.V., Veldhoven (NL)

(*) Notice: Subject to any disclaimer, the term of this patent is extended or adjusted under 35 U.S.C. 154(b) by 329 days.

(21) Appl. No.: 12/967,891

(22) Filed: Dec. 14, 2010

(65) Prior Publication Data
US 2011/0149256 A1   Jun. 23, 2011

Related U.S. Application Data

(60) Provisional application No. 61/288,956, filed on Dec. 22, 2009.

(51) Int. Cl.
| | | |
|---|---|---|
| G03B 27/52 | (2006.01) | |
| G03F 7/20 | (2006.01) | |
| H01J 37/32 | (2006.01) | |

(52) U.S. Cl.
CPC ............ G03F 7/70925 (2013.01); G03F 7/707 (2013.01); H01J 37/32862 (2013.01); H01J 37/32889 (2013.01)
USPC .............................................. 355/30; 355/72

(58) Field of Classification Search
CPC ............. G03F 7/70925; G03F 7/7075; G03F 7/70741; G03F 7/707; G03F 7/70716; A47L 11/405; B08B 7/0035; H01J 37/32862; H01J 2237/335; H01J 37/32513; H01J 37/32807; H01J 37/32889; H01J 37/3289; H01J 37/32715; C23C 16/4405; Y10S 438/905

USPC ................................ 355/53, 72, 75, 30; 134/1.1
See application file for complete search history.

(56) References Cited

U.S. PATENT DOCUMENTS

| | | | | | |
|---|---|---|---|---|---|
| 5,507,874 | A | * | 4/1996 | Su et al. ........................... | 134/1 |
| 5,671,119 | A | * | 9/1997 | Huang et al. ................... | 361/234 |
| 5,676,759 | A | * | 10/1997 | Ye et al. .......................... | 134/1.2 |
| 5,893,962 | A | * | 4/1999 | Mizuno et al. ............ | 118/723 E |

(Continued)

FOREIGN PATENT DOCUMENTS

| | | |
|---|---|---|
| JP | 07-263519 | 10/1995 |
| JP | 11-219939 | 8/1999 |

(Continued)

OTHER PUBLICATIONS

Japanese Office Action mailed Sep. 4, 2012 in corresponding Japanese Patent Application No. 2010-282943.

*Primary Examiner* — Steven H Whitesell Gordon
(74) *Attorney, Agent, or Firm* — Pillsbury Winthrop Shaw Pittman LLP

(57) ABSTRACT

An object suitable for a plasma cleaning treatment in a plasma cleaning device, the object including a first outer surface area; a second outer surface area, wherein the object is constructed and arranged to cooperate with a removable cover such that the cover is connectable to the object to cover the second outer surface area, and wherein the object connected with the removable cover is adapted to be cleaned in the plasma cleaning device such that the plasma cleaning device is not exposed to particles of the second outer surface area and wherein the first outer surface area is cleaned in the plasma cleaning device.

12 Claims, 3 Drawing Sheets

(56) References Cited

U.S. PATENT DOCUMENTS

| | | | |
|---|---|---|---|
| 5,911,833 A * | 6/1999 | Denison et al. | 134/1.1 |
| 7,315,346 B2 | 1/2008 | Van Beek et al. | |
| 2002/0153024 A1 * | 10/2002 | Akiba | 134/1.1 |
| 2004/0165160 A1 | 8/2004 | Van Beek et al. | |
| 2004/0200498 A1 * | 10/2004 | Wang et al. | 134/1.1 |
| 2008/0100812 A1 * | 5/2008 | Poon et al. | 355/30 |
| 2009/0033889 A1 * | 2/2009 | Bleeker et al. | 355/30 |

FOREIGN PATENT DOCUMENTS

| | | |
|---|---|---|
| JP | 2001-203135 | 7/2001 |
| JP | 2004-200686 | 7/2004 |
| WO | WO 2008072641 A1 * | 6/2008 |

* cited by examiner

OBJECT WITH AN IMPROVED SUITABILITY FOR A PLASMA CLEANING TREATMENT

CROSS REFERENCE TO RELATED APPLICATIONS

This application claims priority and benefit under 35 U.S.C. §119(e) to U.S. Provisional Patent Application No. 61/288,956, entitled "Object With An Improved Suitability For A Plasma Cleaning Treatment", filed on Dec. 22, 2009. The content of that application is incorporated herein in its entirety by reference.

FIELD

The present invention relates to a lithographic apparatus and methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Plasma cleaning treatment may be used to remove particles, impurities and contaminants from the surface area of an object through the use of an energetic plasma created from gaseous species. Gases such as argon and oxygen, as well as mixtures such as air and hydrogen/nitrogen may be used. Such an energetic plasma may be created while ionizing a low pressure gas phase. The energetic, ionic gaseous species react with impurities and contaminants on the surface area of the object to be cleaned, often producing gaseous products which can be removed by a vacuum system. The energetic species also clean the surface area by collision with the surface area, knocking off the impurities and contaminants from the surface area. With conventional plasma cleaning treatment of an object having different levels of contamination, it may not be possible to achieve a high level of cleanliness, which may require separately and manually cleaning subassemblies of the object and the packing material. Furthermore, for example, hydrocarbons such as lubricants or oils which are present on the outer surface area of the object might create contamination for the plasma cleaning device itself. There also remains a risk of contamination during assembling the object and the packing material as a whole after the plasma cleaning treatment is carried out.

SUMMARY

An aspect of the invention relates to an object, such as a robot, suitable for a plasma cleaning treatment in a plasma cleaning device, the object having a first outer surface area with a first contamination level and a second outer surface area with a second contamination level, wherein the second contamination level is higher than the first contamination level.

An aspect of the invention is to provide an object with an improved suitability for a plasma cleaning treatment. For that purpose the object is constructed and arranged to cooperate with a removable cover, wherein the cover is connectable to the object to cover the second outer surface area, and wherein the object connected with the removable cover can be cleaned in the plasma cleaning device such that the plasma cleaning device is not exposed to particles of the second outer surface area and wherein the first outer surface area is cleaned in the plasma cleaning device.

This has the technical effect that the removal of particles, impurities and contaminants from the second outer surface area is substantially prevented. This beneficially results in a reduced risk of contamination of the plasma cleaning device itself, which also results in an increased cleanliness of the object itself. A further benefit of such type of object is that it is no longer required to separately and manually clean all subassemblies of the object and the packing material before the plasma cleaning treatment and assembling these subassemblies together again after cleaning, resulting in a significant time reduction of the complete cycle to disassemble, clean and assemble the object. An even further benefit is a significantly reduced risk for new contamination of the object due to the reduction of the required steps to handle the object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
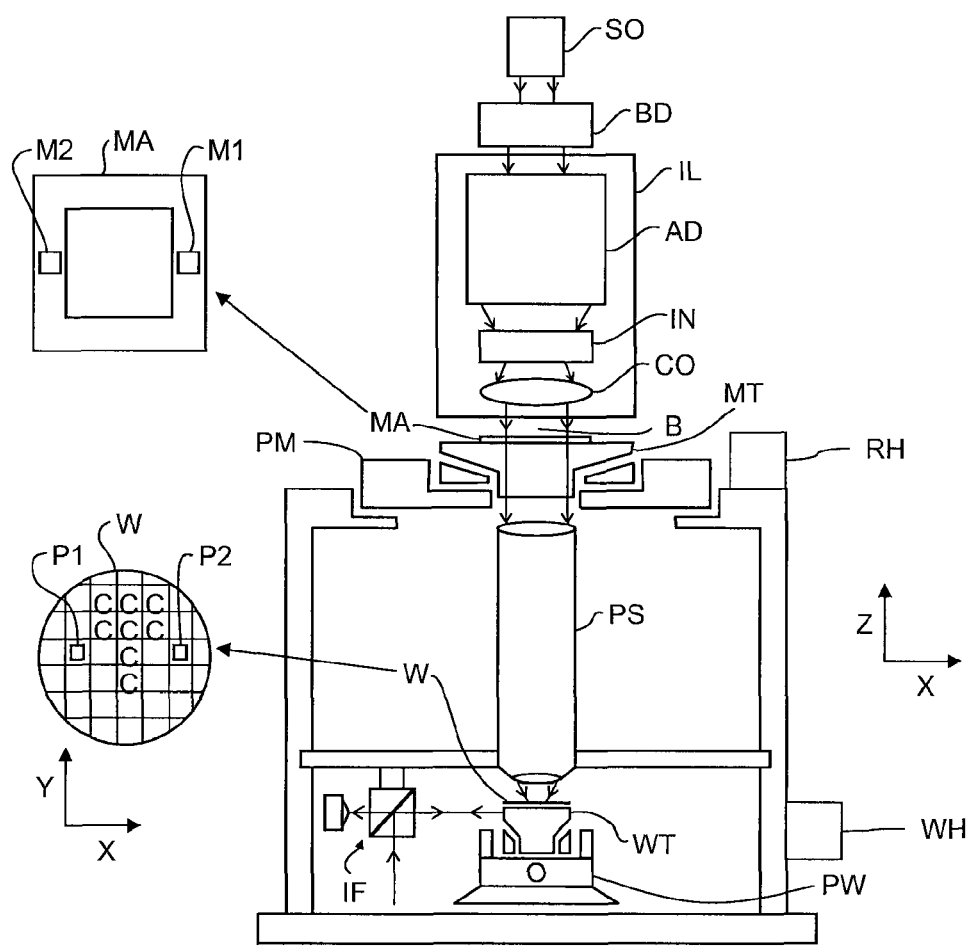
FIG. 1 schematically depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation or EUV radiation).

a patterning device support or support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
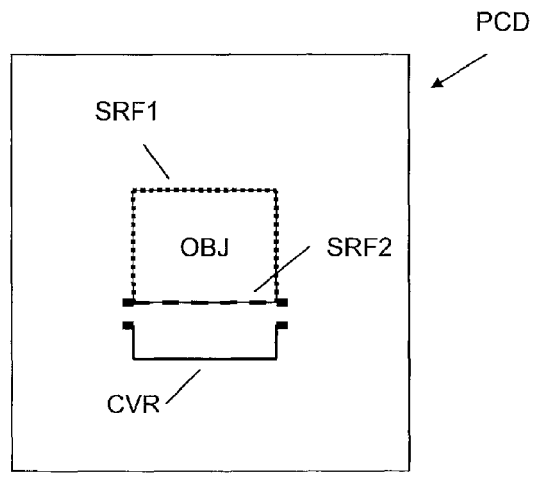
FIG. 2 schematically depicts an object according to an embodiment of the invention placed in a plasma cleaning device.

FIG. 2 schematically depicts a plasma cleaning device (PCD) wherein an object (OBJ) is placed, the object (OBJ) having a first outer surface area (SRF1) with a first contamination level and a second outer surface area (SRF2) with a second contamination level, wherein the second contamination level is higher than the first contamination level. The object (OBJ) is constructed and arranged to cooperate with a removable cover (CVR). Such an object may for example be a wafer handler (WH) constructed and arranged to transport a wafer (W) in and out the lithographic apparatus, or a reticle handler (RH) configured to transport a patterning device (e.g. mask) MA in and out the lithographic apparatus. This is not limiting. It will be appreciated that such an object may also be used in other fields of technology (such as in the pharmaceutical industry).

In an embodiment of the invention the cover (CVR) may be connectable to the object (OBJ) to cover the second outer surface area (SRF2). In such an embodiment the object (OBJ) connected with the removable cover (CVR) can be cleaned in the plasma cleaning device (PCD) in such a way that the plasma cleaning device (PCD) is not exposed to particles of the second outer surface area (SRF2) and the first outer surface area (SRF1) may be cleaned in the plasma cleaning device (PCD) without polluting the plasma cleaning device.

Figure 3:
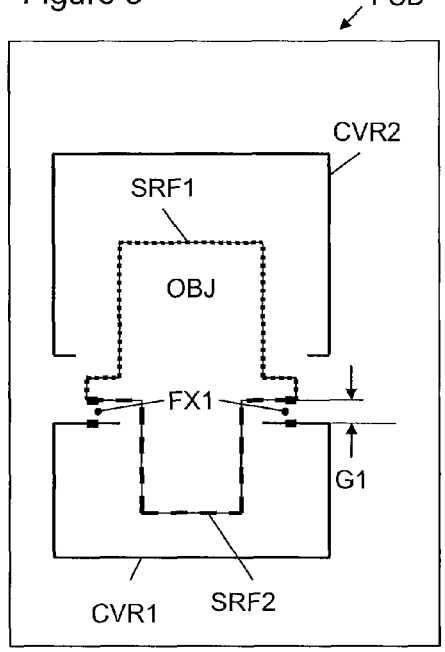
FIG. 3 schematically depicts an object according to an embodiment of the invention placed in a plasma cleaning device.

FIG. 3 schematically depicts an embodiment of the invention, wherein the removable cover (CVR) includes a first cover part (CVR1) and a second cover part (CVR2). The object (OBJ) may be connected to the first cover part (CVR1) using first fixation elements of fastener (FX1), such as bolts, to close a first gap (GP1) between the object (OBJ) and the first cover (CVR1). After fixation of the first fixation elements or fastener (FX1), the second outer surface area (SRF2) is covered by the first cover part (CVR1) to obtain an enclosed environment.

Figure 4:
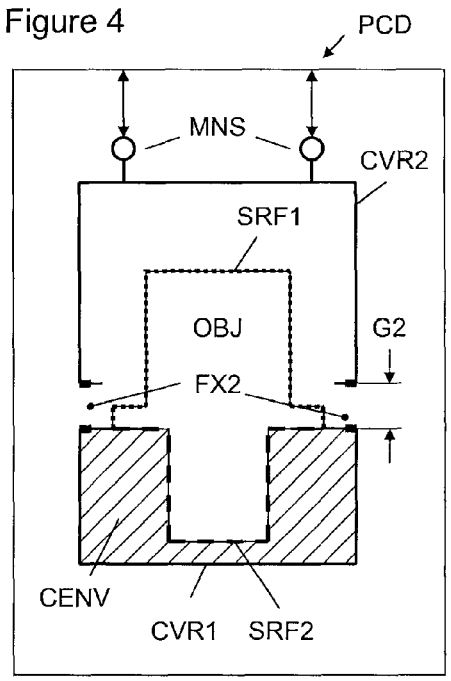
FIG. 4 schematically depicts an object according to an embodiment of the invention during a plasma cleaning treatment.

FIG. 4 schematically depicts how the first surface area (SRF1) may be cleaned by the plasma cleaning device (PCD) while a positioner (MNS) which may be located inside the plasma cleaning device (PCD) position the second cover part (CVR2) with respect to the object (OBJ) and the first cover part (CVR1). For the plasma cleaning treatment of the object (OBJ) the energetic plasma generated within the plasma cleaning device (PCD) can reach the first outer surface area (SRF1) of the object (OBJ) through a second gap (GP2) for the cleaning treatment. Additionally the outer surface area of the first cover (CVR1) and the inner and outer surface area of the second cover (CRV2) are also cleaned during the plasma cleaning process in this embodiment. The impurities and contaminants of the second surface area (SRF2) will not be reached by the energetic plasma and will therefore stay in the enclosed environment (CENV) such that the particles on the second surface area (SRF2) can not contaminate the plasma cleaning device (PCD). After the plasma cleaning treatment the second cover (CVR2) may be connected to the first cover part (CVR1) using the second fixation elements or fastener (FX2) while closing the second gap (GP2) between the first cover (CVR1) and the second cover (CVR2). After closing the cover (CVR) the cover (CVR) including the object (OBJ) are ready for transportation to e.g. a clean room environment for further installment of the object (OBJ). In an embodiment, the first cover (CVR1) may be removed after installment of the object (OBJ).

Figure 5:
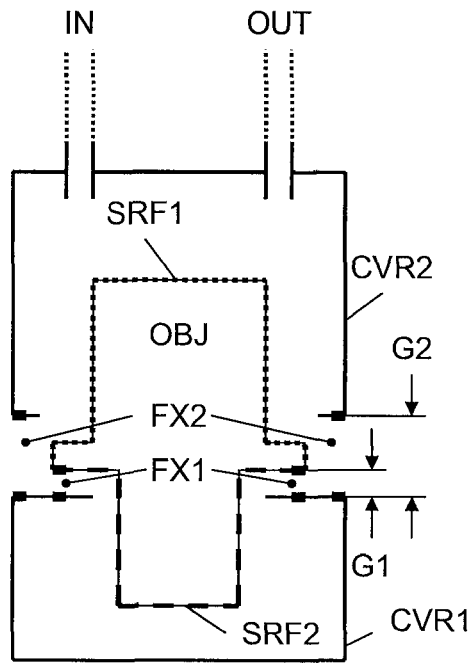
FIG. 5 schematically depicts an object according to an embodiment of the invention while preparing for a plasma cleaning treatment.

FIG. 5 schematically depicts an embodiment of the invention, wherein the removable cover (CVR) includes a first cover part (CVR1) and a second cover part (CVR2). The object (OBJ) may be connected to the first cover part (CVR1) using first fixation elements (FX1), such as bolts, to close a first gap (GP1) between the object (OBJ) and the first cover (CVR1) to obtain and enclosed environment. After fixation of the first fixation elements or fastener (FX1) the second outer surface area (SRF2) is covered by the first cover part (CVR1). The second cover (CVR2) may be connected with the first cover part (CVR1) using the second fixation elements (FX2) while closing the second gap (GP2) between the first cover (CVR1) and the second cover (CVR2). The second cover part (CVR2) may further include an inlet opening (IN) and an outlet opening (OUT).

Figure 6:
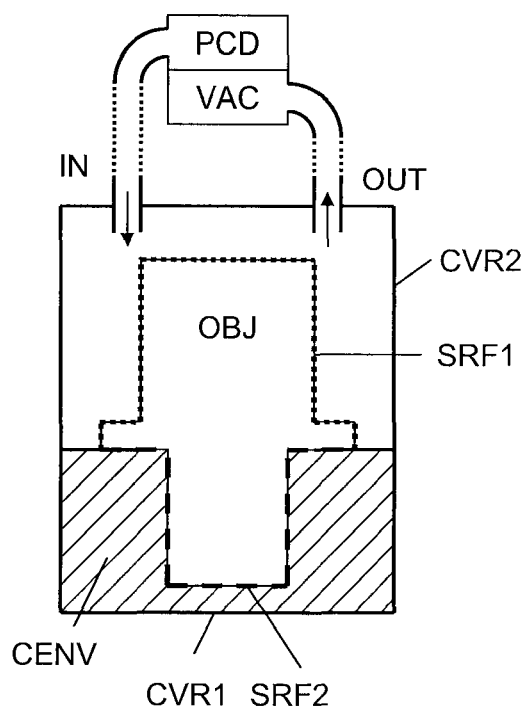
FIG. 6 schematically depicts an object according to an embodiment of the invention during a plasma cleaning treatment.

FIG. 6 schematically depicts that during the plasma cleaning treatment the energetic plasma created by the plasma cleaning device (PCD) is supplied to the object (OBJ) through the inlet opening (IN). Energetic plasma including ionic gaseous species that react with particles, impurities and contaminants present on the first surface area (SRF1) of the object (OBJ) may be removed by a vacuum system (VAC) through the outlet opening (OUT). In this embodiment the plasma cleaning device (PCD) and the vacuum system (VAC) may be enclosed in one single apparatus, but they may also be both independent apparatuses. Further both the plasma cleaning device (PCD) and/or the vacuum system (VAC) may form a part of the second cover part (CVR2) but they may also be available as separate equipment installed near the second cover part (CVR2).

For the plasma cleaning treatment of the object (OBJ) the energetic plasma generated within the plasma cleaning device (PCD) can reach the first outer surface area (SRF1) of the object (OBJ) through the inlet opening (IN). Additionally the inner surface area of the second cover (CVR2) is also cleaned during the plasma cleaning process in this embodiment. This has the benefit that a smaller total surface area is cleaned, requiring less energetic plasma that is furthermore applied more directly to the relevant surface areas. Also in this embodiment the particles, impurities and contaminants of the second surface area (SRF2) will not be reached by the energetic plasma and will therefore stay in the enclosed environment (CENV).

Figure 7:
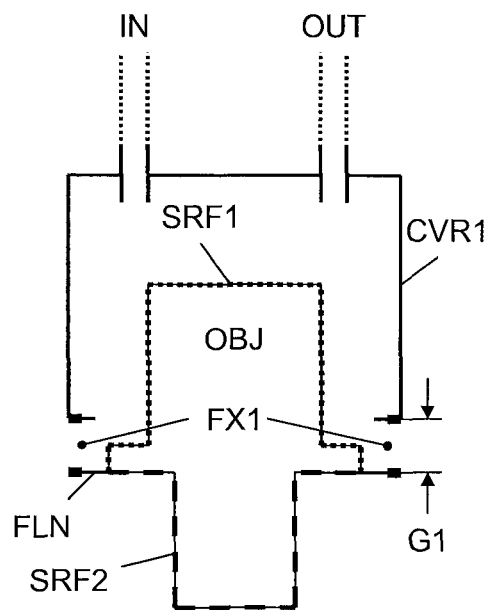
FIG. 7 schematically depicts an object according to an embodiment of the invention while preparing for a plasma cleaning treatment.

FIG. 7 schematically depicts a further embodiment of the invention, wherein the removable cover (CVR) includes a first cover part (CVR1). The object (OBJ) is constructed and arranged with for example a flange (FLN) such that the object (OBJ) may be connected directly to the first cover part (CVR1) using first fixation elements or fastener (FX1), such as bolts, to close a first gap (GP1) between the object (OBJ) and the first cover (CVR1). The first cover part (CVR1) may further include an inlet opening (IN) and an outlet opening (OUT) as explained in detail earlier. The plasma cleaning treatment of the object (OBJ) is similar as that described according to FIGS. 5 and 6, but providing the object (OBJ) with a flange (FLN) reduces the requirement for a second cover part (CVR2). Such an embodiment might be used in cases where the first surface area (SRF1) requires a plasma cleaning treatment, but where for instance the contamination level of the second surface area (SRF2) is not the main risk.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

The invention claimed is:

1. An object suitable for a plasma cleaning treatment in a plasma cleaning device, the object comprising:
   a first outer surface area;
   a second outer surface area, and
   a fastener constructed and arranged to cooperate with a removable cover such that the cover is connectable to the object with said fastener to cover the second outer surface area so as to create an enclosed environment between the removable cover and the object, and
   wherein the object connected with the removable cover is adapted to be cleaned in the plasma cleaning device such that the plasma cleaning device is not exposed to particles present on the second outer surface area and wherein the first outer surface area is cleaned in the plasma cleaning device.

2. The object of claim 1, wherein the first outer surface has a first contamination level and the second outer surface has a second contamination level and the second contamination level is higher than the first contamination level.

3. The object of claim 1, wherein the object is a substrate handler in a lithographic apparatus.

4. The object of claim 1, wherein the object is a patterning device handler.

5. The object of claim 1, wherein an outer surface of the removable cover is cleaned in the plasma cleaning device during cleaning of the first outer surface area.

6. A lithographic apparatus comprising:
   a patterning device support configured to support a patterning device, the patterning device adapted to pattern a beam of radiation to form a patterned beam of radiation;
   a substrate table configured to support a substrate;
   a projection system configured to project the patterned beam of radiation onto the substrate, and
   an object suitable for a plasma cleaning treatment in a plasma cleaning device, the object comprising
   a first outer surface area;
   a second outer surface area, and
   a fastener constructed and arranged to cooperate with a removable cover such that the cover is connectable to the object with said fastener to cover the second outer surface area so as to create an enclosed environment between the removable cover and the object, and
   wherein the object connected with the removable cover is adapted to be cleaned in the plasma cleaning device such that the plasma cleaning device is not exposed to particles present on the second outer surface area and wherein the first outer surface area is cleaned in the plasma cleaning device.

7. The apparatus of claim 6, wherein the first outer surface has a first contamination level and the second outer surface has a second contamination level and the second contamination level is higher than the first contamination level.

8. The apparatus of claim 6, wherein the object is a substrate handler.

9. The apparatus of claim 6, wherein the object is a patterning device handler.

10. The apparatus of claim 6, wherein an outer surface of the removable cover is cleaned in the plasma cleaning device during cleaning of the first outer surface area.

11. An object suitable for a plasma cleaning treatment in a plasma cleaning device, the object comprising:
   a first outer surface area;
   a second outer surface area; and
   a removable cover configured to cover the second outer surface area so as to create an enclosed environment between the removable cover and the object,
   wherein the object is adapted to be cleaned in the plasma cleaning device such that the plasma cleaning device is not exposed to particles present on the second outer surface area and wherein the first outer surface area is cleaned in the plasma cleaning device.

12. The object of claim 11, wherein an outer surface of the removable cover is cleaned in the plasma cleaning device during cleaning of the first outer surface area.

\* \* \* \* \*